United States Patent [19]

Raffoux

[11] 4,376,266

[45] Mar. 8, 1983

[54] DEVICE FOR THE MONITORING OF PEAK VALUES OF A NONPERIODIC PHENOMENON WITH A LOW RECURRENCE RATE

[75] Inventor: Jean-Paul Raffoux, Paris, France

[73] Assignee: Jaeger, Levallois-Perret, France

[21] Appl. No.: 196,016

[22] Filed: Oct. 10, 1980

[30] Foreign Application Priority Data

Oct. 15, 1979 [FR] France ............................ 79 25598

[51] Int. Cl.³ .......................................... G01N 27/42
[52] U.S. Cl. ................................... 324/426; 324/429; 307/359
[58] Field of Search ................ 307/351, 359; 324/425, 324/426, 428, 123 R, 123 C

[56] References Cited

U.S. PATENT DOCUMENTS 3,564,287 2/1971 Todd ..................................... 307/359
3,743,950 7/1973 Sellari et al. ........................ 307/359
4,295,097 10/1981 Thompson et al. ................. 324/429

Primary Examiner—Michael J. Tokar
Attorney, Agent, or Firm—Schwartz, Jeffery, Schwaab, Mack, Blumenthal & Koch

[57] ABSTRACT

Disclosed is a device for the measurement of peak values of a nonperiodic phenomenon having a low recurrence rate. A voltage comparator has one input connected to the potential $U_e$ to be measured with its output connected through a rectifying circuit to a parallel RC circuit. The output of the rectifying circuit is also connected to a high input impedance circuit whose output which is indicative of the peak value measured is connected back to the other of the comparators inputs. The time constant of the parallel RC circuit is an inverse function of the error included in the output of the high input impedance circuit during an interval separating two peak values. The invention is particularly useful to indicate very accurately the state of discharge of lead-acid power batteries.

6 Claims, 4 Drawing Figures

DEVICE FOR THE MONITORING OF PEAK VALUES OF A NONPERIODIC PHENOMENON WITH A LOW RECURRENCE RATE

BACKGROUND OF THE INVENTION

The present invention relates generally to devices for the measurement of peak values of a nonperiodic phenomenon having low rates of recurrence and in particular the application of said device to the indication of the state of discharge of a lead power battery.

The phenomenon that is desired to be measured is in the form (shown in FIG. 1), wherein a variable decreases in a discontinuous manner, as a function of time, in successive stages. The stages are furthermore separated by intervals of random duration, in the course whereof said variable decreases in an unsignificant fashion but while maintaining a value that is always less than that of the subsequent stages. Moreover, the duration of the said intervals is short with respect to the total duration of the decrease.

Let us consider the case of a decreasing potential (FIG. 1), in the manner mentioned hereinabove, from a value U max to a value U min during a relatively long period of time T (several hours) in n successive stages, $U_1, U_2 \ldots U_n$, separated by intervals of short duration t compared with T (of an order of tens of seconds, yielding a T/t ratio of the order of 5000), during which the potential assumes insignificant values that are lower even than U min. Direct measurements of such a potential by means of a voltmeter are thus excluded. One prior art solution to this problem consists of using an integrating voltmeter capable of damping the deviation of the needle, but the error of measurement is very large in such a case, on the order of 20 to 50%. Another solution consists of using a sampling method, i.e. to preserve the value of the preceding stage during the duration of the interval in order to take into consideration the new stage, making it necessary to know a second variable (intensity). Another approach to a solution consists therefore of accurately measuring the value of each stage and to determine, in the intervals, in the most accurate manner possible of the rate of decline of the last value measured, until the next value is determined. The exact rate of the decrease is given by the straight line $d_1$, the slope $\alpha$ whereof may be expressed as follows:

$$\alpha = h/T = \frac{xU}{T}$$

wherein x is the total fractional decrease of the potential U and T is the total time for this decrease. It may be seen that if U has a value of several volts and the time T is several hours, the value of $\alpha$ will be very low, of the order of several microvolts per second.

Analog circuits having a time constant this high cannot be designed, and it is therefore necessary to utilize a numerical device which is expensive and bulky in order to monitor the rate of decline. If an analog circuit must be used, it must be able to operate with a lesser time constant and for this purpose, in the time interval t, a rate of decrease with a greater slope, in the form of the straight line $d_2$, must be accepted. This greater slope is equivalent to accepting in each of these intervals a certain percentage of error y in the indication read. The slope of the straight line $d_2$ is then described by the expression given hereinbelow, assuming that the decrease according to the slope $\alpha$, during an interval of time t, is very small:

$$\beta = (yx/t)U = (yT/t)\alpha$$

Assuming a value of y of the order of 2% and of T/t of the order of 5000, the value of $\beta$ will be approximately 100 times higher than that of $\alpha$. The time constant of an analog circuit capable of reproducing such a decrease thus would be of the order of tenths of millivolt/sec. A circuit having such a time constant is conceivable.

SUMMARY OF THE INVENTION

According to the invention, the measuring device comprises a voltage comparator, which receives at its positive input the potential representing the value to be measured and at its negative input the potential issuing from an impedance adaptor circuit. The impedance circuit has a high input impedance and a low output impedance. The input of the impedance circuit is connected to a charging circuit comprising a low inverse current diode and a charge resistance which is in series with the output of the voltage comparator. A discharge circuit, formed by a condenser and a resistance connected in parallel, is connected between the charging circuit and the impedance circuit. The discharge circuit has a time constant that is an inverse function of the error permissible in the indication of the measure during an interval separating two successive stages.

BRIEF DESCRIPTION OF THE DRAWINGS

A more complete appreciation of the invention and the attendant advantages thereof will be more clearly understood by reference to the following drawings wherein.

DETAILED DESCRIPTION OF PREFERRED EMBODIMENTS

Figure 1:
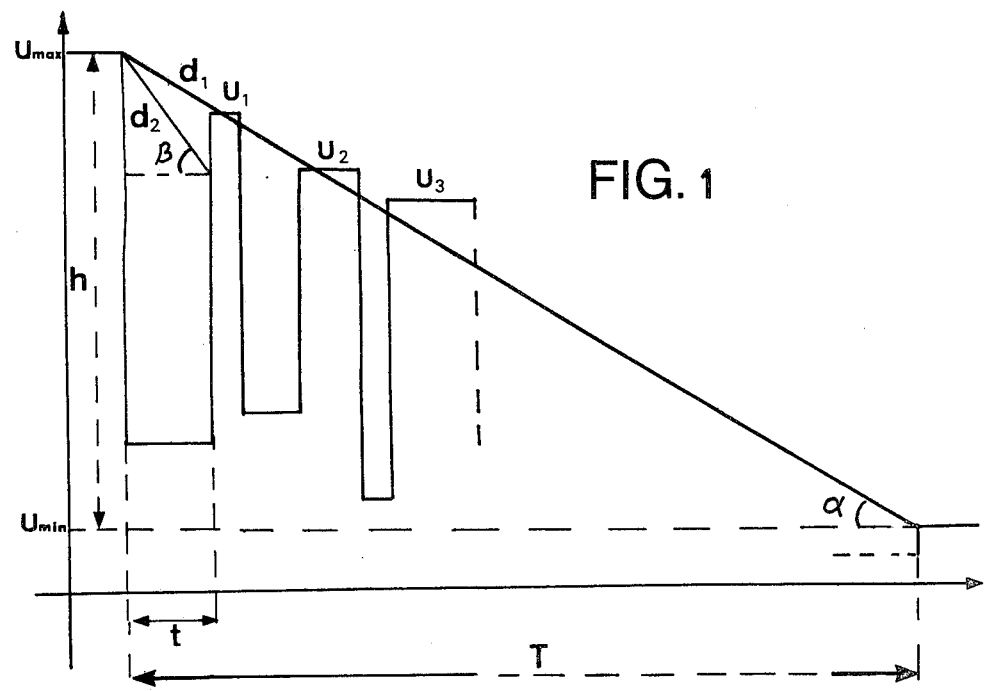
FIG. 1 is a graph of voltage versus time illustrating the phenomenon to be measured.
Figure 2:
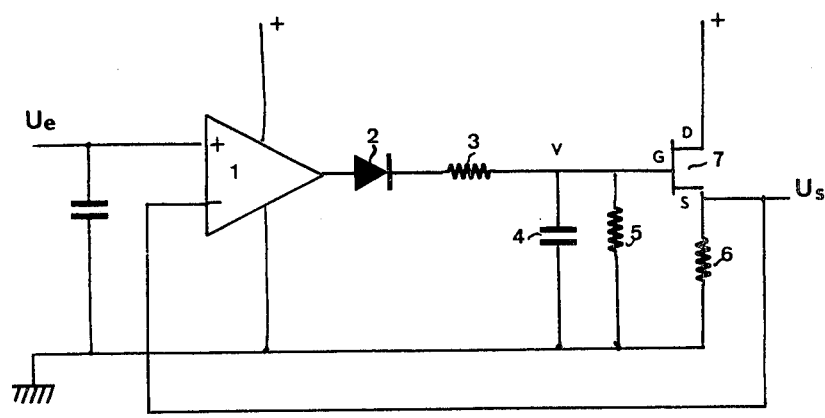
FIG. 2 is an electronic circuit diagram according to one embodiment of the present invention.

Referring now to the drawings wherein like reference characters designate like parts throughout the several views, a comparator 1 (FIG. 2) receives at its positive input the potential $U_e$ to be measured.

A comparator 1 (FIG. 2) receives at its positive input the potential $U_e$ to be measured. It is followed by a charging and discharging circuit comprising a low inverse current diode 2, supplied by the output of the comparator, a charging resistance 3 in series with the diode 2, a condenser 4 and a resistance 5 in parallel with the terminals of said condenser. The charging and discharging circuit is followed by an impedance adaptor circuit, with a high input impedance and a low output impedance, comprised of a field effect transistor. The FET input G is connected with the high terminal of the condenser 4 and the output S, charged by means of a resistance 6, is fed back to the negative input of the comparator 1. At any moment, the output potential $U_s$ is compared in the comparator 1 with the input potential $U_e$. If the $U_e$ potential is higher than $U_s$, i.e. if a stage is present, a potential appears at the output of said comparator, the diode 2 conducts, and the condenser 4 is charged until $U_s$ equals $U_e$. The output potential of the comparator 1 then becomes lower than the potential on the terminals of the condenser 4, the diode 2 is blocked and the condenser 4 discharges into the resistance 5. The potential $U_s$ decreases slowly at a rate $dU/dt=\beta$, as defined hereinabove, until $U_e>U_s$ is again obtained, which signifies that the next stage has been attained and the cycle then recommences.

This apparatus makes it possible to measure the state of the charge in a lead power battery, such as those used in material handling vehicles. It is known that in a lead battery the electromotive force is a function of the density of the electrolyte and increases with it, in accordance with a law that is nearly linear, while during discharge the density of said electrolyte decreases at a rate which again is essentially linear. It is thus sufficient to measure the electromotive force of a battery to obtain a measure of its state of discharge to more than 80% of its nominal capacity, which renders it necessary that its state of discharge should be determinable at any moment.

With an open circuit, the potential of a well charged element is of the order of 2.15 V. During discharge, i.e. in service, the potential varies between a slightly lower value and a minimum (1.8 to 1.4 V) or "stop voltage", which depends on the intensity and duration of the discharge. The total duration of the discharge, at the end of which the capacity of the battery is no more than 80% of its nominal capacity, is generally between 5 and 8 hours, and at the end of this period of time, the open circuit potential of an element will be of the order of 1.95 V, representing a potential drop of 200 mv, which corresponds to 10% of the nominal potential. Let V be the potential on the terminals of the discharge circuit, R the value of the resistance 5 and C the capacity of the condenser 4, then:

$V = RC\beta$
$V = RC(yx/t)U$
$RC = t/(yx)(V/U)$

Figure 3:
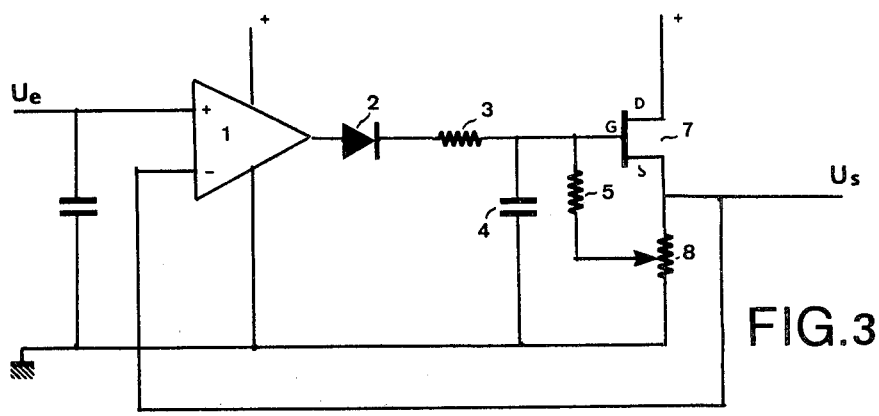
FIG. 3 is an electronic circuit diagram in accordance with a further embodiment of the present invention.

Assuming, as has been done hereinabove, that $y=2\%$ and x is equal to 10%, then $RC = (1/0.02 \times 0.1)t(V/U) = 500t(V/U)$ If t is on the order of several seconds, then the value of the resistance and of the capacity must be high, but may be limited by technical reasons (stability, temperature and humidity resistance ...) and space considerations. Assuming, for example, that $R=100$ M$\Omega$ and $C=5$ $\mu$f, then:

$V/U = (RC)/500t = (100.10^6 \times 5.10^{-6})/500t = 1-/t \ll 1$ and thus, because V cannot be of the same order of magnitude as U, it is necessary to provide a voltage divider at the terminals of the memory circuit in one embodiment a part of the charging resistance 6 of the transistor 7. In this case, the polarization potential GS of said transistor must also be taken into consideration, which is not constant from one transistor to the other, since discrepancies are found. In order to provide fine controls, the charging resistance 6 is replaced (FIG. 3) by a potentiometer 8 and the resistance 5 is split between the high terminal of the condenser 4 and the slide of said potentiometer.

Figure 4:
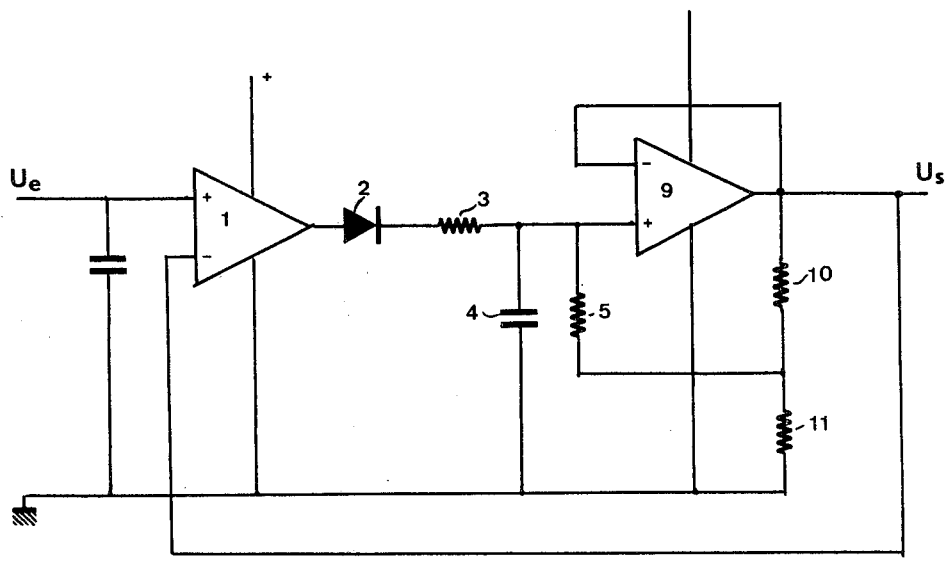
FIG. 4 is an electronic circuit diagram of a still further embodiment of the present invention.

In order to facilitate control by means of the potentiometer, in place of the FET transistor 7 a field effect operational amplifier 9 (FIG. 4) may be used; it does not have a potential shift between the input and the output and is fed back (for unitary amplification) to its negative input. In this case, the resistance 5 is split at a divisor point formed by the resistances 10 and 11. A convenient optimization of the components in this case even makes it possible to measure phenomena for which t is of the order of several minutes. If it is desired to maintain the same value of RC, it is then necessary to decrease the potential V, resulting in a lower discharge V/R and consequently a diode 2 and an amplifier 9 having a relatively low leakage current must be chosen, which is known in the present state of the technology.

In all of the cases, the output potential $U_s$ may be used to actuate a measuring voltmeter, an alarm device or a device capable of preventing certain maneuvers (for example the hoisting of elevator cars), or simultaneously a plurality of these devices.

What is claimed is:

1. An analog discharge signal monitor for monitoring a voltage signal from a power battery, said signal including a slow monotonous variation having peak values indicating no load periods of said battery, said peak values interspersed with non-significant portions of the signal during load periods of said battery, said non-significant portions having a variable duration, said duration being small with respect to the average time of discharge, said monitor comprising:

comparator means for comparing two inputs and for providing an output indicative of said comparison, one of said inputs being connected to terminals of said battery to receive a signal indicating the voltage produced by said battery;

means for rectifying said comparator means output, said rectifying means connected in series with said comparator means output, said rectifying means having an output;

parallel RC circuit means having a resistance, said RC circuit means coupled in parallel with the output of said rectifying means; and high input impedance means having an input and an output, said impedance means input connected in parallel with said parallel RC circuit means, said impedance means output providing discharge information, said impedance means having said output coupled back to said other of said comparator inputs wherein said parallel RC circuit means has a time constant RC which substantially satisfies the condition $RC = t\ V/yxU$ where:

U is the initial peak value of the voltage of said battery;

V is the voltage across the RC circuit means with said peak value U applied to the monitor;

x is the predetermined fractional decrease in the voltage U permitted after which said battery is determined to be discharged;

t is an estimated value of the time duration of intervals between no load conditions of said battery wherein t is significantly shorter than the actual discharge time of said battery; and y is the permissible fractional error between the actual voltage decrease which takes place in said battery during time t and the decrease in voltage indicated by the output of said high input impedance means during time t.

2. The signal monitor as claimed in claim 1, wherein said high input impedance means comprises resistive means, said resistive means interconnected with said RC circuit means to provide a portion of said resistance in said RC circuit means.

3. The signal monitor as claimed in claim 1, wherein said high input impedance means comprises a field effect transistor.

4. The signal monitor as claimed in claim 3, wherein said high input impedance means includes a potentiometer in series with said field effect transistor, said potentiometer having a variable slider means for varying the resistance of said potentiometer, said resistance in said RC circuit is connected between the output of said rectifying means and the variable slider means of said potentiometer.

5. The signal monitor as claimed in claim 1, wherein said high input impedance means comprises an operational amplifier with a field effect input, the non-inverting input of which is connected to the output of said rectifying means and in parallel with said parallel RC circuit means.

6. The signal monitor as claimed in claim 5, wherein said monitor includes a voltage divider coupled across the output of said operational amplifier and ground, said voltage divider having a voltage dividing terminal, said RC circuit means resistance is connected between the output of said rectifying means and said voltage dividing terminal.

* * * * *